United States Patent [19]

Guenin

[11] 4,255,743

[45] Mar. 10, 1981

[54] METHOD FOR DIGITAL INTERPOLATION OF A PERIOD OF A THREE-PHASE ANALOG SIGNAL

[75] Inventor: Albert Guenin, Arisdorf, Switzerland

[73] Assignee: Contraves AG, Zürich, Switzerland

[21] Appl. No.: 49,577

[22] Filed: Jun. 18, 1979

[30] Foreign Application Priority Data

Jun. 26, 1978 [CH] Switzerland ............... 6929/78

[51] Int. Cl.³ .................................. H03K 13/02
[52] U.S. Cl. ........................ 340/347 SY; 33/1 T; 356/138; 356/141; 318/653
[58] Field of Search ............. 340/347 M, 347 SY; 318/653-660; 356/138-141; 33/1 T

[56] References Cited

U.S. PATENT DOCUMENTS

| | | | |
|---|---|---|---|
| 3,310,798 | 3/1967 | Wingate | 340/347 M X |
| 3,533,097 | 10/1970 | Sleven | 340/347 SY |

FOREIGN PATENT DOCUMENTS

| | | |
|---|---|---|
| 2642925 | 5/1977 | Fed. Rep. of Germany . |
| 407569 | 8/1966 | Switzerland . |
| 466593 | 1/1969 | Switzerland . |
| 499091 | 12/1970 | Switzerland . |

Primary Examiner—Thomas J. Sloyan
Attorney, Agent, or Firm—Werner W. Kleeman

[57] ABSTRACT

The value of three components of an analog signal are compared with zero and in two's compared with one another. Each possible combination of the comparison result, within the range of possible phase argument values of the analog signal, has correlated therewith a respective zone, whereby there is formed a coarse interpolation of a period of the analog signal into phase zones. The components are digitized and there are selected the components having the smallest (X), the intermediate (Y) and the largest (Z) absolute value. There are formed the digital functions $H = Y - X$ and $K = Z - Y + X$. Each possible combination (H, K) is correlated to a respective predetermined number of steps of the phase argument within the zone, thereby producing a fine interpolation of the zone into steps. Preferably, at the beginning there is substracted from each analog component one-third of the sum of the three components.

The method is especially employed for the interpolation of three-phase measuring signals of photocells during the angular measurement in for flight path measurement theodolites.

4 Claims, 8 Drawing Figures

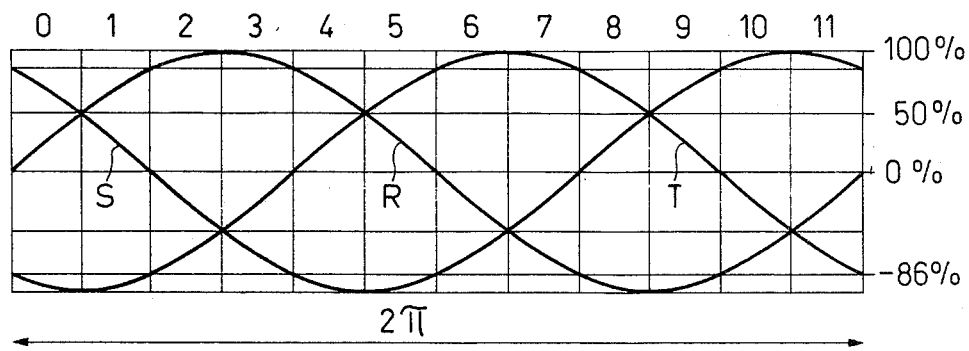
FIG. 2
FIG. 3
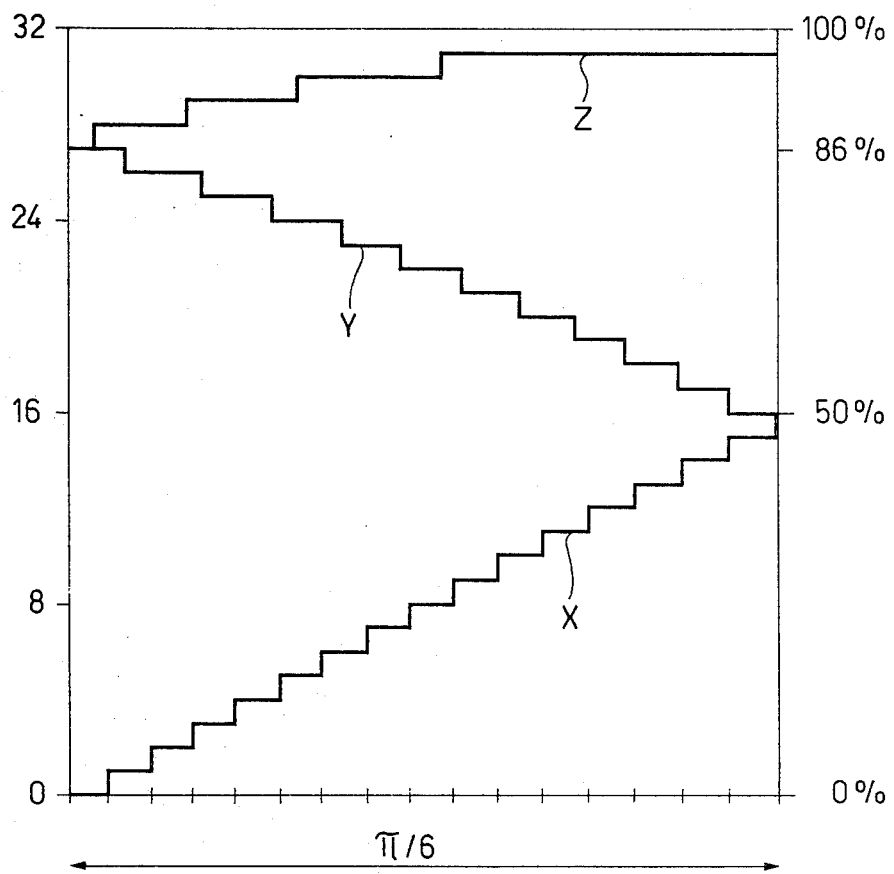

| H\K | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | | | | | | | | | | | 14 | 15 | 15 | 15 | 15 | 15 |
| 1 | | | | | | | | | | | 13 | 14 | 14 | 14 | 14 | 14 | 14 |
| 2 | | | | | | | | | | 12 | 13 | 13 | 13 | 13 | 13 | 13 |
| 3 | | | | | | | | | 11 | 12 | 12 | 12 | 12 | 12 | 12 | |
| 4 | | | | | | | | 10 | 10 | 10 | 11 | 11 | 11 | 11 | | |
| 5 | | | | | | | 8 | 9 | 9 | 9 | 10 | 10 | 10 | | | |
| 6 | | | | 5 | 6 | 7 | 7 | 7 | 8 | 9 | 9 | | | | | |
| 7 | | | 3 | 4 | 5 | 5 | 6 | 7 | 8 | 8 | | | | | | |
| 8 | | 2 | 3 | 3 | 4 | 5 | 6 | 7 | 8 | | | | | | | |
| 9 | 1 | 2 | 2 | 3 | 4 | 5 | 6 | | | | | | | | | |
| 10 | 0 | 2 | 2 | 3 | 4 | 4 | | | | | | | | | | |
| 11 | 0 | 1 | 2 | 3 | 3 | | | | | | | | | | | |
| 12 | 0 | 1 | 2 | 2 | | | | | | | | | | | | |
| 13 | 0 | 0 | | | | | | | | | | | | | | |
| 14 | | | | | | | | | | | | | | | | |
| 15 | | | | | | | | | | | | | | | | |

METHOD FOR DIGITAL INTERPOLATION OF A PERIOD OF A THREE-PHASE ANALOG SIGNAL

BACKGROUND OF THE INVENTION

The present invention relates to a new and improved method for digital interpolation of a period of a three-phase analog signal, whose components (phases) constitute a periodic function of a measuring magnitude, especially the position during a linear or angular measurement.

Generally speaking, the digital interpolation method of the invention is of the type wherein the values of the components are compared with zero and each two such values compared with one another. Each possible combination of the comparison result has operatively correlated therewith a respective zone which is defined within the range of possible phase argument values of the analog signal, and the value of at least one of the components experiences an analog-digital conversion.

It is already known in the art to produce an analog signal of the previously mentioned type, to digitize the same, and to evaluate it for the purpose of furnishing a measuring value. Significant in this respect is, for instance, Swiss Pat. No. 499,091. It is also known to interpolate the periods of the analog signal, in order to improve the resolution of the digital evaluation. In this respect there is pertinent, by way of example, Swiss Pat. No. 407,569, German Patent Publication No. 2,642,925 and U.S. Pat. No. 3,310,798.

In the case of high precision measuring devices, such as, for instance, flight-path measurement theodolites, it is possible to obtain, by means of the interpolation technique disclosed in U.S. Pat. No. 3,533,097, a suitable resolution. In this United States Patent there is started with a three-phase analog signal, whose phase argument is a linear function of a measured magnitude or quantity, so that the three components (phases) of the analog signal each constitute a respective periodic function of the measured quantity. The values of the components are compared with zero and each two of them with one another. Each possible combination of the comparison result is correlated with a respective zone defined in the range of possible phase argument values of the analog signal. There is thus produced a coarse interpolation of a period of the analog signal into twelve zones of the phase argument. In each zone there is selected the component having the smallest absolute value. The variation of such component with the phase argument is that of a sine function, the argument of which varies between 0 and $\pi/12$, and thus, the variation of the selected component with respect to the measured quantity deviates from linearity. During the analog-digital conversion of the selected component there is simultaneously compensated the aforementioned deviation, so that there is obtained a digital value, which (considered apart from the quantization) constitutes a linear function of the measured quantity. In this way there is obtained a fine interpolation of the zone into steps, and the number of steps in the zone is equal to the highest possible digital value. The desired result of the interpolation is realized from the combination of the obtained number of zones and the obtained number of steps. Depending upon the obtained number of zones the number of steps should be accounted for positively or negatively, in order to take into account the symmetry properties of the variation of the components with the phase argument.

A first drawback of this interpolation method resides in the fact that, there is required a special circuit design in order to linearize the variation of the digital value with the measured quantity or magnitude. A further drawback is seen in terms of the fact that, the selected component must of necessity be a sine function of the measured quantity, since otherwise the fine interpolation becomes faulty. There is indeed presupposed that each digital value can be unambiguously correlated with a step of the phase argument. In the aforementioned U.S. Pat. No. 3,533,097 there are described measures in order to free such correlation, and consequently, the result of the interpolation, from fluctuations of the amplitude of the sine function. However, to carry out such measures it is necessary to produce the three-phase analog signal as a three-phase alternating-current voltage, and additionally, to provide an alternating-current voltage serving as amplitude and phase reference. Therefore, the teachings of such U.S. Pat. No. 3,533,097 cannot be readily employed for the interpolation of other types of analog signals, particularly not for the interpolation of a signal of the type delivered by the equipment described in Swiss Pat. No. 466,593 for reading Mioré-fringe images in a highly precise angle measuring system of a flight-path measuring theodolite. The signal emanating from the aforementioned equipment does not constitute an alternating-current voltage, it is time-dependent only through some possible time-dependence of the measured quantity and, upon standstill of the theodolite, in principle is constant. Additionally, this signal is produced by photocells, so that, on the one hand, the mean or average value of the analog signal might be shifted by a DC-voltage part, and, on the other hand, there can arise at each component appreciable deviations from the ideal sinusoidal course as a function of the measured quantity.

SUMMARY OF THE INVENTION

Therefore, with the foregoing in mind it is a primary object of the present invention to provide a new and improved method for digital interpolation of a period of a three-phase analog signal in a manner not associated with the aforementioned drawbacks and shortcomings of the prior art proposals.

Another and more specific object of the present invention aims at providing a method of the previously mentioned type which also can be employed for such analog signals, whose course can deviate from a sine function of the measured quantity or magnitude and whose amplitude and mean value can have fluctuations as a function of time.

Now in order to implement these and still further objects of the invention, which will become more readily apparent as the description proceeds, the digital interpolation method of the invention is manifested by the features that from the analog-digital converted values of all three components there are determined those having the smallest absolute value (X), the intermediate absolute value (Y) and the largest absolute value (Z), there are formed two digital auxiliary values (H,K) in accordance with the functions $H = Y - X$ and $K = Z - Y + X$, and each possible combination of such auxiliary values is correlated with a certain number of steps of the phase argument within the respective zone of the phase argument range of the analog signal.

BRIEF DESCRIPTION OF THE DRAWINGS

The invention will be better understood and objects other than those set forth above, will become apparent when consideration is given to the following detailed description thereof. Such description makes reference to the annexed drawings wherein throughout the various Figures the same or analogous elements have been designated with the same reference characters, and wherein:

FIG. 2 is a diagram serving to explain the subdivision of the periods of a three-phase analog signal into zones;

FIG. 3 is a diagram for illustrating the values X, Y, Z in the zone 0 of FIG. 2;

DETAILED DESCRIPTION OF THE PREFERRED EMBODIMENTS

Figure 1:
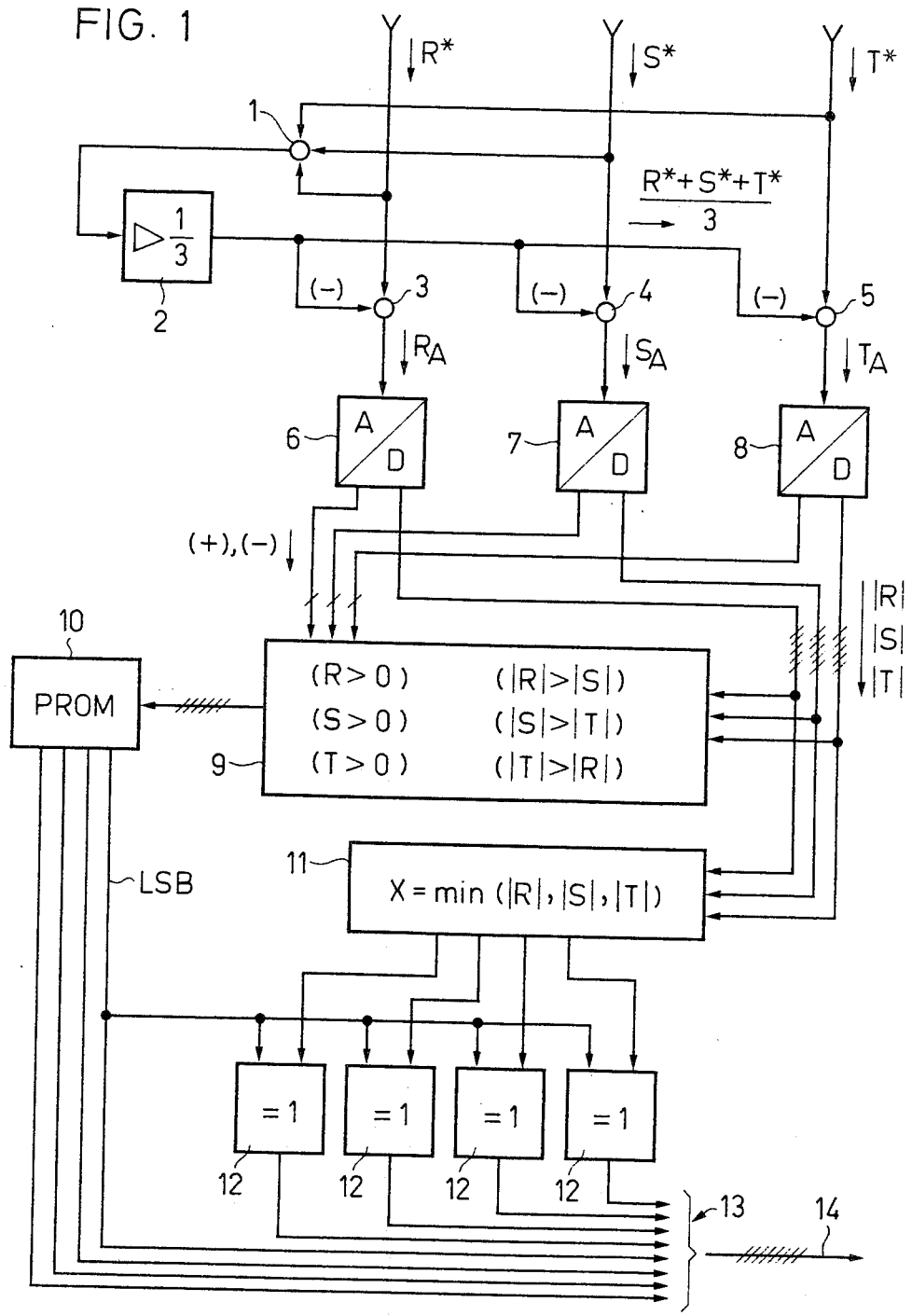
FIG. 1 is a block diagram of a circuit for performing the method of the invention.

Describing now the drawings, FIG. 1 shows in block diagram a circuit for the digital interpolation of a three-phase analog signal $R^*$, $S^*$, $T^*$, which, for instance, has been generated in an angle measuring device of the type disclosed in Swiss Pat. No. 466,593 or by a three-phase synchronous generator. The components (phases) $R^*$, $S^*$, $T^*$ can vary approximately sinusoidally as a function of a rotational angle and are phase shifted relative to one another by $\pm 2\pi/3$. From the components $R^*$, $S^*$, $T^*$ there are formed digital values which are positioned symmetrically about the value zero. For this purpose there is subtracted from each component $R^*$, $S^*$, $T^*$ the value $\frac{1}{3}$. $(R^* + S^* + T^*)$. It can be demonstrated that, with a three-phase analog signal, there prevail for the corrected components $R_A$, $S_A$, $T_A$ the following relationships:

$$R_A = R^* - \frac{R^* + S^* + T^*}{3}$$

$$S_A = S^* - \frac{R^* + S^* + T^*}{3}$$

$$T_A = T^* - \frac{R^* + S^* + T^*}{3}$$

wherein, in each case two of the corrected components have the same amplitude and opposite sign when the third corrected component equals null. This characteristic is independent of possible errors of the entire three-phase analog signal $R^*$, $S^*$, $T^*$, such as, for instance, a common shifting of the zero level or a common modulation of the amplitudes or the phases of the three components. The circuitry for forming the corrected components $R_A$, $S_A$, $T_A$ from the components $R^*$, $S^*$, $T^*$, essentially consists of an adder unit or adder 1, an amplifier 2 having the amplifaction factor or gain $\frac{1}{3}$ and three subtracting units 3, 4, 5, it being known to realize these functions by operational amplifiers arranged in a suitable circuit configuration. The analog components $R_A$, $S_A$, $T_A$ are each converted, in a respective analog-digital converter 6, 7, 8, into digital values R, S, T, and at the output of each converter there appears a respective 6-bit-digital value (5-bit-absolute value and 1-bit for the sign).

The values R, S, T are delivered to the input of an address circuit 9. In this address circuit 9, the construction of which will be described more fully hereinafter in conjunction with FIG. 4, the entire range of possible values of the digital components R, S, T is subdivided into a number of zones, each of which has unambiguously correlated thereto a respective combination of fulfillment decisions determined by the following six inequalities:

(a) $R > 0$
(b) $S > 0$
(c) $T > 0$
(d) $|R| > |S|$
(e) $|S| > |T|$
(f) $|T| > |R|$.

In order to eliminate cases of uncertainty there is determined that for each boundary case, such as $R = 0$ or $|R| = |S|$, there is correlated the decision "non-fulfillment". The decision correlated with each of the six inequalities is logically expressed, for instance according to the rule "fulfillment = 1, non-fulfillment = 0" and used for addressing an allocation storage 10, preferably a PROM. For this purpose a 6-bit-line leads from the output of the address circuit 9 to the address input of the allocation storage 10.

FIG. 2 and the following Table I illustrate the combinations of decisions, possible with the values R, S, T, for the six inequalities (a) . . . (f). In FIG. 2 there has been illustrated a complete period of the combination of values R, S, T. Along the abscissa there is plotted the phase, corresponding to the instantaneous values R, S, T, whereas these instantaneous or momentary values are plotted along the ordinate, and the amplitude is set equal to 100%. Although the values R, S, T are digitally indicated, and therefore, quantized, this is not recognizable in FIG. 2, because the resolution along the ordinate, with the scale of the drawing, is not adequate for this purpose. It is apparent from the showing of FIG. 2 that along the abscissa, in other words in the phase range, the period is subdividable into twelve zones of the same width, and in each case there occurs a zone change at that location where at least one of the values R, S, T passes through one of the ordinate values 0%, $\pm 50\%$, $\pm 86\%$. During a zone change there thus varies at least one of the decisions "1" or "0" of the six inequalities (a) . . . (f), which has been illustrated in the following Table I:

TABLE I

| Zone: | 0 | 1 | 2 | 3 | 4 | 5 | 6 | 7 | 8 | 9 | 10 | 11 |
|---|---|---|---|---|---|---|---|---|---|---|---|---|
| (a): | 1 | 1 | 1 | 1 | 1 | 1 | 0 | 0 | 0 | 0 | 0 | 0 |
| (b): | 1 | 1 | 0 | 0 | 0 | 0 | 0 | 0 | 1 | 1 | 1 | 1 |
| (c): | 0 | 0 | 0 | 0 | 1 | 1 | 1 | 1 | 1 | 1 | 0 | 0 |
| (d): | 0 | 1 | 1 | 1 | 0 | 0 | 0 | 1 | 1 | 1 | 0 | 0 |
| (e): | 0 | 0 | 0 | 1 | 1 | 1 | 0 | 0 | 0 | 1 | 1 | 1 |
| (f): | 1 | 1 | 0 | 0 | 0 | 1 | 1 | 1 | 0 | 0 | 0 | 1 |

The designation of the zones is accomplished by a number between 0 and 11, wherein there are required 4-bits to express the same in the binary number system.

Therefore, the allocation storage 10 is provided with a 4-bit-output. It is programed such that, when it is addressed in accordance with the decisions concerning the six inequalities (a) . . . (f), there appears at its output the designation of the zone correlated according to Table I. In this way there is formed an interpolation of the period of the three-phase analog signal R*, S*, T* into twelve zones.

The absolute value of the components R, S, T, is delivered in the form of a 5-bit-binary number by the analog-digital converters, 6, 7, 8. By appropriate amplification, for instance, of the components $R_A$, $S_A$, $T_A$, it is possible to adjust the amplitude of the components such that the 5-bit resolution (32-steps) is fully utilized. On the other hand, a comparison of the different zones of FIG. 2 among one another reveals that in each zone there occurs the same absolute value of a respective one of the components R, S, T, whereas the course of such absolute value at the phase range—i.e., as a function of the abscissa—in each two respective neighboring zones is mirror-image symmetrical about the intermediately dispositioned zone boundary (zone 0 and zone 11 are considered to be neighboring).

There are now defined three values X, Y, Z such that X, in each case, constitutes the smallest, Y the intermediate and Z the largest of the three absolute values $|R|$, $|S|$, $|T|$. In FIG. 3 there have been shown the values X, Y, Z within the zone 0 of FIG. 2. There has been plotted along the abscissa the phase course in the zone and along the ordinate the corresponding instantaneous values. The scale of the drawing here reveals the quantization. As apparent, the thirty-second step terminates at the amplitude 100%. As will be apparent from the preceding discussion, for all twelve zones there can be illustrated by the same FIG. 3 the course of the values X, Y, Z, provided there is illustrated along the abscissa the suitable phase section with the suitable direction. The width of the illustrated phase section, for all of the zones, is equal to $\pi/6$, corresponding to the distance between two zone boundaries at the phase region, but the phase increases however along the abscissa from the left towards the right at the zones 0, 2, 4, 6, 8, 10 and from the right towards the left at the zones 1, 3, 5, 7, 9, 11. Since an amplitude of 100% has been quantized in thirty-two steps, a single step is exactly equal to the value 3.125%. Therefore, the range of change of X encompasses the steps 0 to 15, that of Y the steps 16 to 27 and that of Z the steps 27 to 31. From FIG. 3 there will be recognized that the change of X, on the average, occurs quite linearly. Consequently, the quantization of X into sixteen steps can be employed for the quantization of the $\pi/6$-phase section of each zone in that, between each step of X and a respective corresponding phase section there is realizable a one-to-one unambiguous allocation or correlation. In this way there is formed an interpolation of each of the zones into sixteen steps.

The formation of the values X, Y, Z from the absolute values $|R|$, $|S|$, $|T|$, is accomplished, as best seen by referring to FIG. 1, in a selector 11, details of which will be described more fully hereinafter in conjunction with FIG. 4. The absolute values $|R|$, $|S|$, $|T|$ are delivered by means of a respective 5-bit-line from the output of a respective analog-digital converter 6, 7, 8 to the input of the selector 11, i.e., from the 6-bit-output of the relevant analog-digital converter there is, in this case, not employed the line which carries the information bit concerning the sign. At the output of the selector 11 there appears at a 4-bit-line the value X, which is equal to the smaller one of the values $|R|$, $|S|$, $|T|$ 4-bits suffice to completely designate any step by numbering it in a binary numeration system, since the span of variation of X only amounts to sixteen steps).

A complete period of the analog signal R*, S*, T* is thus divided into twelve zones each containing sixteen steps, i.e., into a total of 192 steps. In the binary system each of these 192 steps is designated by an 8-bit-number between 00000000 and 10111111. The four highest-significant bits of such number correspond to the zone designation, i.e., the output of the allocation storage 10. The four lowest-significant bits of this number define an auxiliary binary number which corresponds to the step designation, i.e., the output of the selector 11, but here however it is necessary, at the zones 1, 3, 5, 7, 9, 11, to take into account the reversal of the abscissa direction in FIG. 3. While for the zones 0, 2, 4, 6, 8, 10, it is possible to directly remove for the output of the selector 11 the four lowest-significant bits of the binary number i.e. the auxiliary binary number, these four lowest-significant bits, at the zones 1, 3, 5, 7, 9, 11, are equal to the complement of the binary number which can be obtained at the output of the selector 11. It can be demonstrated that in this manner the steps of FIG. 3 can be counted from the right towards the left. For this purpose there are provided in the circuit arrangement of FIG. 1 four Exclusive-OR-gates 12. Each one of these Exclusive-OR-gates 12 has delivered to its input side a respective one of the four bits from the output of the selector 11 and the least-significant bit LSB from the output of the allocation storage 10. Thus, when the zone designation is even, the four bits of the output of the selector 11 also appear without change at the relevant outputs of the Exclusive-OR-gates 12. On the other hand, of the zone designation is uneven, then the Exclusive-OR-function causes the complementing of the momentary four bits of the output of the selector 11, and at the output of the relevant Exclusive-OR-gate there appears the desired complement. Thereafter, at the system location 13 there occurs the combining of the outputs of the allocation storage 10 and the Exclusive-OR-gates or elements 12 for forming the previously defined 8-bit-binary number. The latter appears at the 8-bit-line 14 and there is portrayed, the digital form, the interpolation of the three-phase analog system R*, S*, T* in 192 steps per period.

Figure 4:
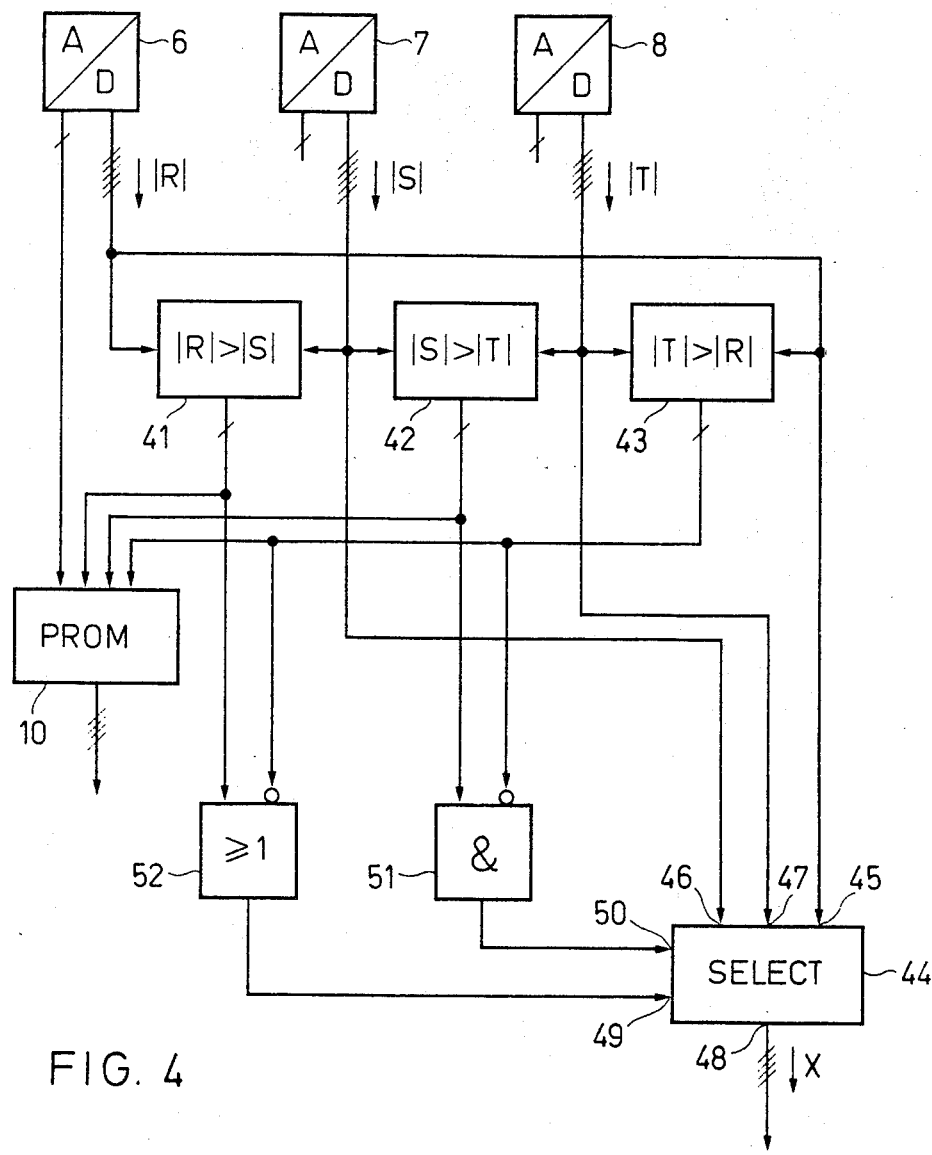
FIG. 4 is a block circuit diagram illustrating a possible construction of the address circuit 9 and the selector 11 of the arrangement of FIG. 1.

Now in FIG. 4 there is shown a possible construction of the address circuit 9 and the selector 11 of FIG. 1, wherein, as a matter of convenience, several of the elements shown in FIG. 1 have been designated in FIG. 4 by the same reference characters. The address circuit 9 of FIG. 1, in the arrangement of FIG. 4, consists of the elements constituting the connection between the analog-digital converters 6, 7, 8 and the allocation storage 10. In contrast to the more general functional diagram of FIG. 1, the circuitry of FIG. 4 has been simplified. From Table I there will be recognized that for the complete designation of a zone 4-bits suffice for numbering that zone in a binary numeration system, namely a respective bit for the decision determined by the absolute value-inequalities (d), (e), (f) and a further bit for only one of the decisions concerning the sign-inequalities (a), (b), (c). The decisions (d), (e), (f) are made in a respective digital comparator 41, 42, 43. A respective input of one such comparator has infed thereto one of the values $|R|$, $|S|$, $|T|$ from the corresponding output of one of the analog-digital converters 6, 7, 8. At the output of the comparator 41 there appears, for instance, the logical value "1", when there is valid the relationship $|R| > |S|$, and the logical value "0", when there is satisfied the condition $|R| \leq |S|$. In analogous fashion, the same holds true for the comparators 42 and 43, i.e., there always appears the logical value "1" when there is satisfied the condition $|S| > |T|$ or $|T| > |R|$, and in the other cases the logical value "0". The outputs of the comparators 41, 42, 43 are connected with a respective related address input of the allocation storage 10. In order to complete the addressing the sign-bit output of the analog-digital converter 6 is connected with a related address input of the allocation storage 10, so that, for instance, there can be infed to such input the logical value "1" when there is valid the relationship $R > 0$. The allocation storage 10 is, by way of example, a PROM, the function of which is programed in accordance with Table II given hereinafter. It will be apparent that the information content of Table I and Table II is the same, i.e., Table I is redundant. At the output of the allocation storage 10 there appears at a 4-bit-line the data concerning the zone designation (0 to 11) in binary system. It is here still to be mentioned that the decisions (a) to (f) also can be made based upon an analysis of the analog components $R_A$, $S_A$, $T_A$, in which case then there are employed analog comparators; nothing changes appreciably as far as this part of the method is concerned.

TABLE II

| Zone: | 0 | 1 | 2 | 3 | 4 | 5 | 6 | 7 | 8 | 9 | 10 | 11 |
|---|---|---|---|---|---|---|---|---|---|---|---|---|
| Signal | | | | | | | | | | | | |
| from 6: | 1 | 1 | 1 | 1 | 1 | 1 | 0 | 0 | 0 | 0 | 0 | 0 |
| from 41: | 0 | 1 | 1 | 1 | 0 | 0 | 0 | 1 | 1 | 1 | 0 | 0 |
| from 42: | 0 | 0 | 0 | 1 | 1 | 1 | 0 | 0 | 0 | 1 | 1 | 1 |
| from 43: | 1 | 1 | 0 | 0 | 0 | 1 | 1 | 1 | 0 | 0 | 0 | 1 |

The selector 11 of FIG. 1, in the circuit arrangement of FIG. 4, consists of the elements which provide the connection between the analog-digital converters 6, 7, 8 and the Exclusive-OR-gates or elements 12. A selection element 44 receives at a respective value input 45, 56, 47 a respective one of the values $|R|$, $|S|$, $|T|$ from the output of the corresponding analog-digital converter 6, 7, 8. The selection element 44 is equipped with a 4-bit-output 48, from where a respective bit is infed to a respective one of the Exclusive-OR-elements 12. Finally, the selection element 44 is provided with two control inputs 49 and 50. Depending upon the binary code appearing at the control inputs 49 and 50, there appears at the output 48 of the selection element 44 one of the values $|R|$, $|S|$, $|T|$ appearing at its value inputs 45, 46, 47. The correlation between the code and the value input which is switched through to the output, is accomplished according to a predetermined selection table, for instance the hereinafter give Table III; suitable selection elements are commercially available and are well known in the art.

TABLE III

| Code appearing at the control outputs 49 & 50 | | The output 48 is then connected with |
|---|---|---|
| 0 | 0 | Input 45 |
| 0 | 1 | Input 46 |
| 1 | 0 | |
| 1 | 1 | Input 47 |

From FIG. 2 it will be apparent that the smallest of the three values $|R|$, $|S|$, $|T|$ at the zones 0, 5, 6, 11 is the value $|R|$, at the zones 1, 2, 7, 8 is the value $|S|$, and at the zones 3, 4, 9, 10 is the value $|T|$. The corresponding decisions concerning the absolute value inequalities (d), (e), (f) are apparent from Table II. It can be demonstrated that the combination of decisions (d), (e), (f), leading to the correct code at the control inputs of the selection element 44, results in the fact that there is infed to a respective control input a respective Boolean function (e * f̄) and (d + f̄). This is obtained by means of the circuit shown, by way of example in FIG. 4 and described in the disclosure to follow, wherein, however, it is to be clearly understood that other circuit designs are equally possible, for instance utilizing an allocation storage. An AND-gate 51 receives at a non-inverting input the value (e) from the output of the comparator 42 and at an inverting input the value (f) from the output of the comparator 43. The value (e * f̄) appears at the output of the AND-gate 51 and is delivered to the control input 50 of the selection element 44. An OR-gate or element 52 receives at a non-inverting input the value (d) from the output of the comparator 41 and at an inverting input the value (f) from the output of the comparator 43. The value (d + f̄) appears at the output of the OR-gate or element 52 and is infed to the control input 49 of the selection element 44. Since the value of X amounts to at most sixteen steps, 4-bits suffice to completely designate any value of X in a binary numeration system at the output 48 of the selection element 44. For the same reason 4-bits would equally suffice for the infeed of the values $|R|$, $|S|$, $|T|$ to the value inputs of the selection element 44. The highest-significant bit from the output of the analog-digital-converters 6, 7, 8 could be omitted with such connections, since for the selected value this bit always carries the logical value "0"; however, there has been dispensed with such detailed illustration in FIG. 5, in order to preserve clarity in the showing of the drawings and in the subsequent explanations.

The method which has been described previously on the basis of the disclosed circuitry, essentially resides in the features that three components of the analog signal are employed for subdividing a period of the analog signal into twelve zones and, in each case, the smaller of the three absolute values of the components is digitized with 4-bits, in order to obtain, in each zone, an interpolation into sixteen steps, so that finally a period of the analog signal is divided into 192 steps. Of course, an interpolation of the zones can be accomplished in a different number of steps. In the description to follow there will also be demonstrated that two-phase and four-phase analog signals can be interpolated in accordance with the same method. Finally, it is advantageous, in the case of a three-phase analog signal, to correct the components in the manner described previously, in order to free them from zero level displacements and from modulation. For this purpose, there is subtracted, from each component, one-third of the sum of all components.

The interpolation which is obtained with this method, is however sensitive to individual changes of the amplitude of the components of the three-phase analog signal and also to waveforms of the components which deviate from a sinusoidal configuration. In order to reduce such disturbing effects there can be employed data or information which is present in the described circuit, but not used, because it is redundant. As will be understood by referring to FIG. 3, from the values X, Y, Z there can be formed the auxiliary values $H = Y - X$ and $K=Z-Y+X$, which have been illustrated in FIG. 5 with the same coordinate system as in FIG. 3. As a function of the phase course at the zone O the course of the auxiliary values H and K, on the average, is quite linear. Now if, for instance, because of an amplitude change, the values R*, S*, T* increase or decrease by the same percentual amount (the cause can be predicated, for instance, upon a fluctuation of the supply voltage of the light source in an angle measuring system of the type disclosed in Swiss Pat. No. 466,593), then there ascends or descends the average inclination of both lines H and K in FIG. 5 simultaneously by the same percentual amount, because the auxiliary values H and K are linearly dependent upon X, Y, Z. When the waveform of R*, S* and/or T* deviates from a sinusoidal curve, then both lines H and K are shifted or curved upwardly or downwardly by the same amount, because the auxiliary values H and K are dependent, in the same manner, upon the value $(Y-X)$, whereas the value Z only exerts a slight influence upon the auxiliary values H and K. Therefore, it is possible to produce a Table according to the showing of FIG. 6, in which the auxiliary values H and K, appearing in combination, serve as the respective line or column inputs, whereas at the element where there intersect a respective line and column, there is designated a phase section or step corresponding to the respective combination H, K. It should be imagined that for each phase section or step, which is located along the abscissa of FIG. 5, the corresponding ordinate values are read-off from both of the lines H and K. Then, these ordinate values are used as line and column inputs, and at corresponding elements of the Table there are entered the designation of the corresponding phase section or step. During the erection of such Table it has been found that the 5-bit-resolution of the auxiliary values H and K is much too high, since a number of neighboring elements in the Table designate the same phase section or step. Therefore, in the Table of FIG. 6 the auxiliary values H and K have only been entered with a resolution which has been reduced to 4-bits, which can be realized with a binary system quite simply by omitting the least-significant bit of the values of H and K which have been readout in FIG. 5. The Table of FIG. 6 thus consists of 256 instead of 1024 elements, which for the use of the Table explained hereinafter as a program instruction for an allocation storage (e.g. a PROM) reduces by a factor of four the number of required storage places.

With the just described procedures, however only the elements located approximately along the one diagonal of the Table, are provided with a designation or notation. The Table of FIG. 6 can be expanded or further filled in that empty elements are provided, in each case, with a designation or notation corresponding to the phase section or step which is most probable upon the occurrence of the corresponding auxiliary value combination. To this end, the person skilled in the art, according to his judgment, produces operating hypothesis which encompass different predictable types of errors of the analog signal. From this there result corresponding displacements or deformations of the lines H and K of FIG. 5, whereupon there is further carried out the already explained procedures for reading a correlation of a phase section or step and a pair of auxiliary values H, K in FIG. 5 and for plotting such correlation in the Table of FIG. 6. The Table of FIG. 6 provides an example of the result which can be obtained with such procedures.

Figures 6, 8:
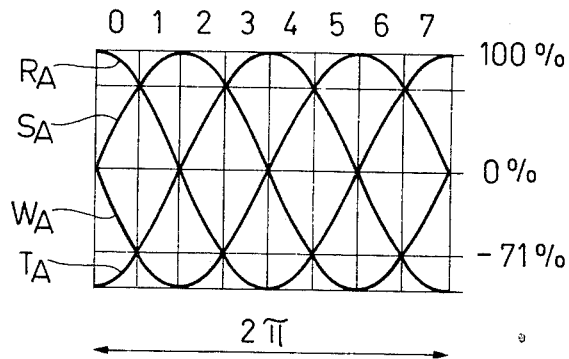
FIG. 6 is a table which has been derived from FIG. 5 for designating a phase section of a zone corresponding to a value pair H, K.
FIG. 8 is a diagram for portraying the subdivision of the period of a two-phase or four-phase analog signal into zones.
Figure 7:
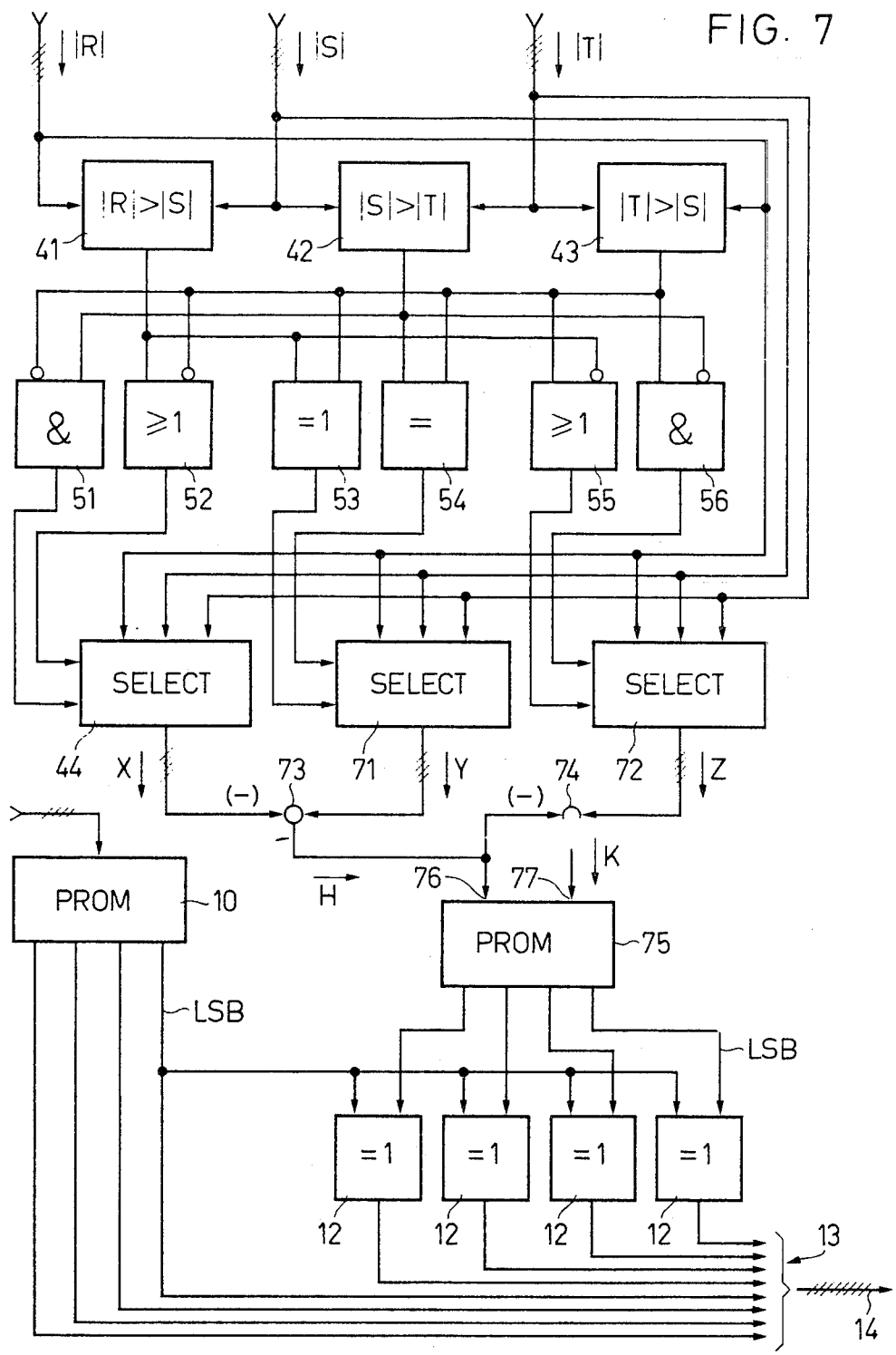
FIG. 7 is a block circuit diagram showing a different construction of the selector 11 of the arrangement of FIG. 1.

FIG. 7 shows a possible construction of part of a circuit for reducing the aforementioned disturbing or spurious effects by using the redundancy of the values X, Y, Z. Just as was the case for the circuitry of FIG. 4, the values $|R|$, $|S|$, $|T|$ from the analog-digital converters 6, 7, 8, not particularly shown in FIG. 7, are infed to the comparators 41, 42, 43. Equally, as was the case for the circuitry of FIG. 4, the decisions concerning the inequalities (d), (e), (f) appear at a respective output of one of these comparators, these decisions are combined with one another in two logic elements or gates 51 and 52, and the output of a respective one of such logic elements is delivered to a respective control input of the selection element 44, whereas a respective value input of the selection element 44 receives a respective one of the values $|R|$, $|S|$, $|T|$. In FIG. 7 there are illustrated two further selection elements 71 and 72, which likewise possess two respective control inputs and at a respective value input receive a respective one of the values $|R|$, $|S|$, $|T|$. All three selection elements 44, 71, 72 are identical to one another and connected in circuit in the same manner, in that upon the appearance of the code 00 at the control inputs of a selection element that value input carrying the value $|R|$ is switched-through to the output of the selection element, whereas upon the appearance of the code 01 or 10 the same occurs in analogous manner for the value $|S|$, and upon the appearance of the code 11 the same occurs in analogous manner for the value $|T|$. Equally as in the circuit arrangement of FIG. 4, the logic elements or gates 51 and 52 are constituted by an AND-gate 51 and an OR-gate 52, the circuitry of which performs the functions $(e * \bar{f})$ and $(d+\bar{f})$, respectively. In FIG. 7 there have been illustrated four further logic elements 53, 54, 55, 56. The logic elements 53 and 54 are constituted by an Exclusive-OR-gate or element 53 and an equivalence element 54, the outputs of which are fed to a respective control input of the selection element 71. A respective input of the Exclusive-OR-gate 53 is connected with a respective output of the comparators 41 and 43, in order to perform the function $(d * \bar{f}+\bar{d} * f)$. A respective input of the equivalence element 54 is connected with a respective output of the comparators 42 and 43, in order to perform the functions $(e * f+\bar{e} * \bar{f})$. Thus, the selection element 71 receives at a respective control input a respective one of such functions. The logic elements 55 and 56 are constituted by an OR-gate or element 55 and an AND-gate or element 56, the outputs of which are delivered to a respective control input of the selection element 72. A respective input of the OR-gate 55 is connected with a respective output of the comparators 41 and 43, in order to perform the function $(\bar{d}+f)$, and the input connected with the comparator 41 is an inverting input. A respective input of the AND-gate 56 is connected with a respective output of the comparators 42 and 43, in order to perform the function $(\bar{e} * f)$, and the input connected with the comparator 41 is an inverting input. It can be demonstrated, based upon the Tables II and III that, in this manner, the selection element 44 always switches-through the smaller, the selection element 52 always the larger and the selection element 71 always the intermediate one of the three values $|R|$, $|S|$, $|T|$ to its output. The smaller value has been designated by X, the intermediate value by Y and the larger value by Z, as best seen by referring to FIG. 3. The circuit for forming the correct code at the control inputs of the selection elements could be designed differently than the previously described circuit, for instance could be provided with an allocation storage, receiving at three inputs the decisions (d), (e), (f) as address and delivering at three pairs of outputs the corresponding code. It is also here to be mentioned that the values X, Y, Z, by omitting the least-significant bit at the output of the relevant selection element 44, 71, 72, appears as 4-bit-values, because here a 4-bit-resolution is sufficient, as such has been explained in conjunction with the Table of FIG. 6.

Figure 5:
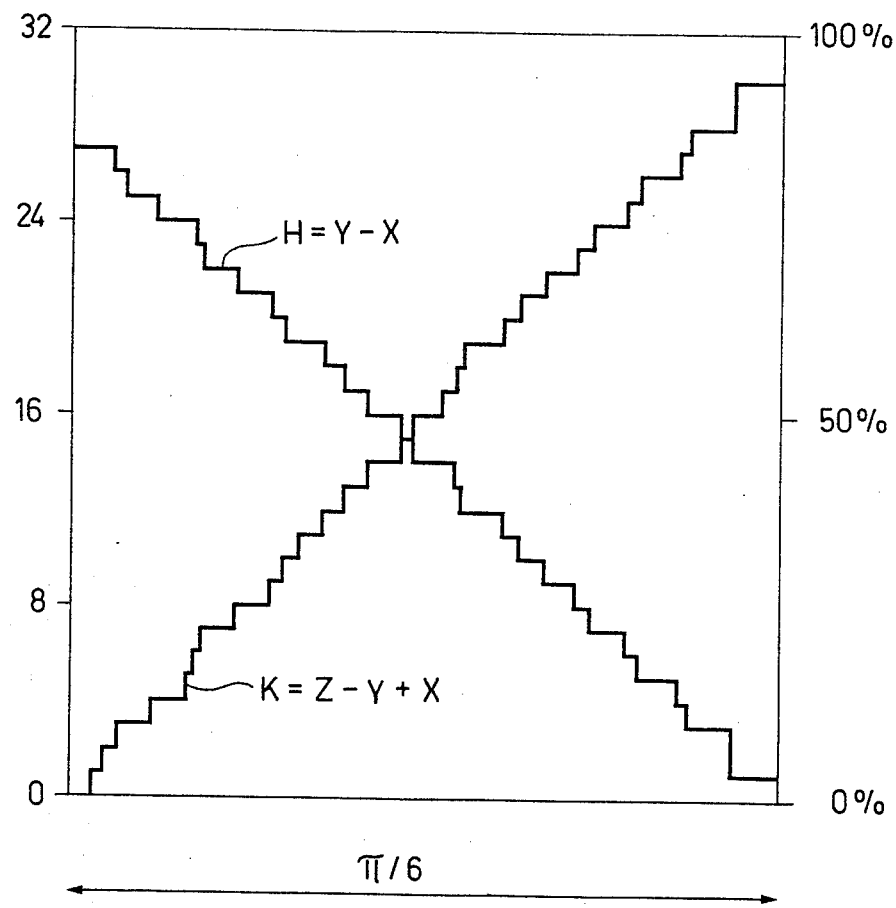
FIG. 5 is a diagram for portraying the values H and K in the zone 0 of FIG. 2.

The circuit for forming the auxiliary values H, K, defined in conjunction with FIG. 5, from the values X, Y, Z essentially consists of the binary subtracting units 73, 74 of FIG. 7 which are connected in conventional manner for performing the functions $H = Y - X$ and $K = Z - Y + X$. From the 4-bit output of a respective one of the subtracting units 73, 74 there is delivered a respective auxiliary value H, K to a respective 4-bit-address input of an allocation storage 75, for instance a PROM. At a 4-bit output of this allocation storage 75 there appears the value, addressed by the auxiliary values H and K, according to the data which has been decimally entered into the Table of FIG. 6. The 4-bit-output of the allocation storage 75, similar to the case for the output of the selector 11 of FIG. 1, is connected with a respective input of an Exclusive-OR-element or gate 12, whereas a respective further input of such Exclusive-OR-gates or elements 12, like for the circuit arrangement of FIG. 1, has infed thereto the least-significant bit LSB from the allocation storage 10. The function of the Exclusiver-OR-elements 12 and the allocation storage 10 is the same as for the arrangement of FIG. 1, and thus, as in FIG. 1, there appears, following the combining of the outputs at location 13 into an 8-bit-line 14, the result of the interpolation of the three-phase analog signal R*, S*, T* in 192 steps per period, but here extensively freed of faults caused by changes in the amplitude of the individual components of the analog signal or by waveforms of such components which deviate from a sinusoidal shape.

The improvement of the method described previously on the basis of the explained circuit thus resides essentially in the fact that, in each case, the smaller (X), the intermediate (Y) and the larger (Z) components or the three-phase analog signal are digitized with a 4-bit resolution and combined according to the equations $H = Y - X$ and $K = Z - Y + X$, in order to form two auxiliary values H, K which, on the average, have an approximately linear course with the phase of the analog signal. By means of such auxiliary values there is addressed in allocation storage, the output of which delivers the designation or notation of a corresponding interpolation step. Hence, there is utilized the redundancy occurring during the simultaneous use of the values X, Y, Z, in order to avoid the influence of amplitude changes and waveform faults of any component of the three-phase analog signal.

In the case of a two-phase analog signal with components R*, S* phase-shifted by $\pi/2$, it is not possible to correct the components by subtracting the value $(R^* + S^*)/2$. The corresponding circuit section must be omitted, and there must be established the relationship $R_A = R^*$ and $S_A = S^*$. On the basis of the showing of FIG. 8, which is valid for a two-phase analog signal instead of the three-phase signal node of FIG. 2, it will be recognized that the period of the two-phase analog signal $R_A$, $S_A$ can be subdivided into eight zones by means of events $R_A = 0$, $S_A = 0$ and $|R_A| = |S_A|$. In the case of a four-phase analog signal with components which are phase-shifted in each instance by $\pi/2$, it is possible, on the other hand, to generate a corrected analog signal $R_A$, $S_A$, $T_A$, $W_A$, in that in each case there is subtracted from the components R*, S*, T*, W* the sum $(R^* + S^* + T^* + W^*)/4$. On the basis of FIG. 8, which also corresponds to a four-phase analog signal, there will be recognized that also the period of the four-phase analog signal $R_A$, $S_A$, $T_A$, $W_A$ is subdivided into eight zones by means of the events $R_A = 0$, $|R_A| = |S_A|$ and so forth. In both such cases there however can only be formed two values X and Y which are defined as the smaller (X) and the larger (Y) of the absolute values of the digitized components. In the case of a four-phase analog signal the absolute values of the corrected components are equal in two's. Since now in such instances, the variation span of the value X lies between 0% and 71% of the amplitude 100%, it is advantageous to provide such an amplification that this variation span can be exactly resolved into sixteen steps. Then, the phase section, corresponding to one zone, in this case $\pi/4$, again is divided into sixteen steps. Where indeed this subdivision is in no way linear (one step amounts to a value between 50.3 to 66.3 mrad), even so the linearity cannot be appreciably improved upon even by forming an auxiliary value $H = Y - X$. Two-phase the four-phase analog signals are thus interpolatable in eight zones each having sixteen steps, i.e., in 128 steps. With a measuring system there is, however, preferred the generation and transmission of the measured value or quantity by a three-phase analog signal, because in this way, with smaller amplification, there can be obtained, a greater number of steps and better linearity of the interpolation.

With the mentioned typical field of application of the described apparatus and the described circuitry for angle measurement in a flight-path measurement theodolite, the resolution obtained when practicing the invention amounts to 50,000 periods of 192 steps for a full revolution, i.e, 9.6million steps per revolution. With the smallest used rotational speed (one revolution per day) there is obtained a data density per unit of time amounting to about 111 steps per second, which is better practically by a factor of 5 than the temporal information or data density obtainable with the heretofore known state-of-the-art techniques. At the maximum rotational speed (approximately 1.6 rad/s), the data density per unit of time amounts to approximately 40 million steps per second, i.e., a step must be detected within approximately 25 ns. If such data density per unit of time is too high in terms of the processing capability of the electronic system of the servo-drive, then by means of a binary system it is very easy to express the number of steps per unit of time as floating-point binary number having a constant number of significant bits, and thus, to suppress a certain number of lesser significant bits at which the temporal data density is too high.

While there are shown and described present preferred embodiments of the invention, it is to be distinctly understood the the invention is not limited thereto, but may be otherwise variously embodied and practiced within the scope of the following claims. Accordingly,

What I claim is:

1. In a method for the digital interpolation of a period of a three-phase analog signal, the components (phases) of which constitute a periodic function of a measured quantity, especially the position during a linear or angular measurement, wherein the values of the components are compared with zero and each two thereof are compared with one another, each possible combination of the comparison results being correlated with a phase zone defined within the range of possible phase argument values of the analog signal, and the value of each of the components is analog-digital converted, the improvement comprising the steps of:

determining from the analog-digital converted values (R,S,T) of all three components the respective value having the smallest absolute value (X), the intermediate absolute value (Y) and the largest absolute value (Z);

forming two digital auxiliary values (H,K) corresponding to the functions $H=Y-X$ and $K=Z-Y+X$;

constructing an allocation table assigning a predetermined step designation number to each possible combination of such auxiliary values, the total number of possible steps being $2^n$, wherein n is an integer, the step designation number being an integer having a value varying from zero to $2^n-1$ when the phase argument traverses one complete phase zone;

determining from the analog-digital converted values (R,S,T) of all three components the result of fulfillment decisions relative to the inequalities $|R|>|S|$, $|S|>|T|$, $|T|>|R|$, and the result of a fulfillment decision relative to a selected one of the three inequalities $|R|>|0|$, $|S|>|0|$, and $|T|>||$;

constructing an allocation table assigning a predetermined phase zone designation number to each possible combination of such results of the fulfillment decisions, the total number of phase zones being twelve, the phase zone desination number being an integer having a value varying from zero to eleven when the phase argument traverses one complete period;

the step designation number "zero" and the phase zone designation "zero" being assigned to the respective step and phase zone attained when the value of the variable appearing in said selected one inequality infinitesimally increases from zero;

expressing the value of the phase zone designation number and of the step designation number in the binary numeration system, the phase zone desination number thus having four bits and ranging from 0000 to 1011 and the step designation number thus having n-bits and ranging from the n-bit number having all bits equal to 0 to the n-bit number having all bits equal to 1;

forming an auxiliary binary number which is equal to the binary step designation number when the least-significant bit of the binary zone designation number is 0 which is equal to the complement of the binary step designation number when the least-significant bit of the binary zone number is 1 ; and combining the binary zone designation number with the auxiliary binary number to form a binary period interpolation number having n+4 bits of which the four highest -significant bits consist of the binary zone designation number and of which the n-lowest-significant bits consist of the auxiliary binary number.

2. The improvement as defined in claim 1, for use with a three-phase analog signal whose components (R*,S*,T*) constitute a periodic function of the measured quantity, which periodic function slightly deviates from a sine function, in which case said improvement is preceded by the steps of:

forming the sum of the values of the components (R*,S*,T*);

subtracting one-third of such sum from each of the values of said components (R*,S*,T*) in order to obtain a respective corrected value of the respective component ($R_A, S_A, T_A$); and performing the analog-digital conversion on the values of such corrected components ($R_A, S_A, T_A$) to obtain the converted values of the components (R,S,T).

3. In a method for the digital interpolation of a period of a three phase analog signal, the components (phases) of which constitute a periodic function of a measured quantity, especially the position during a linear or angular measurement, wherein the values of the components are compared with zero and each two thereof are compared with one another, each possible combination of the comparison results being correlated with a phase zone defined within the range of possible phase argument values of the analog signal, and the value of each of the components is analog-digital converted, the improvement comprising the steps of:

determining from the analog-digital converted values (R,S,T) of all three components the respective value having the smallest absolute value (X), the intermediate absolute value (Y) and the largest absolute value (Z);

forming two digital auxiliary values (H,K) corresponding to the functions $H=Y-X$ and $K=Z-Y+X$;

constructing an allocation table assigning a predetermined step designation number to each possible combination of such auxiliary values, to total number of possible steps being $2^n$, wherein n is an integer, the step designation number being an integer having a value varying from zero to $2^n-1$ when the phase argument traverses one complete phase zone;

determining from the analog values ($R_A, S_A, T_A$) of the three analog components the result of fulfillment decisions relative to the inequalities $|R|>|S|$, $|S|>|T|$, $|T|>|R|$, and the result of a fulfillment decision relative to a selected one of the three inequalities $|R|>|0|$, $|S|>|0|$, and $|T|>|0|$;

constructing an allocation table assigning a predetermined phase zone designation number to each possible combination of such results of the fulfillment decisions, the total number of phase zones being twelve, the phase zone designation number being an integer having a value varying from zero to eleven when the phase argument traverses one complete period;

the step designation number "zero" and the phase zone designation number "zero" being assigned to the respective step and phase zone attained when the value of the variable appearing in said selected one inequality infinitesimally increases from zero;

expressing the value of the phase zone designation number and of the step designation number in the binary numeration system, the phase zone designation number thus having four bits and ranging from 0000 to 1011 and the step designation number thus having n-bits and ranging from the n-bit number having all bits equal to 0 to the n-bit number having all bits equal to 1;

forming an auxiliary binary number which is equal to the binary step designation number when the least-significant bit of the binary zone designation number is 0 and which is equal to the complement of the binary step designation number when the least-significant bit of the binary zone number is 1; and combining the binary zone designation number with the auxiliary binary number to form a binary period interpolation number having n+4 bits of which the four highest-significant bits consist of the binary zone designation number and of which the n-lowest-significant bits consist of the auxiliary binary number.

4. The improvement as defined in claim 3, for use with a three-phase analog signal whose components (R*,S*,T*) constitute a periodic function of the measured quantity, which periodic function slightly deviates from a sine function, in which case said improvement is preceded by the steps of:

forming the sum of the values of the components (R*,S*,T*);

subtracting one-third of such sum from each of the values of said components (R*,S*,T*) in order to obtain a respective corrected value of the respective component $(R_A, S_A, T_A)$ defining said analog values $(R_A, S_A, T_A)$; and performing the analog-digital conversion on the values of such corrected components $(R_A, S_A, T_A)$ to obtain the converted values of the components (R,S,T).

* * * * *